United States Patent
Park et al.

(10) Patent No.: US 7,304,427 B2
(45) Date of Patent: Dec. 4, 2007

(54) ORGANIC ELECTROLUMINESCENT DEVICE WITH PIXEL REGIONS AND DUMMY PIXEL REGIONS AND METHOD OF FABRICATING THE SAME

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 248 days.

(21) Appl. No.: 10/743,877

(22) Filed: Dec. 24, 2003

(65) Prior Publication Data

US 2004/0135496 A1    Jul. 15, 2004

(30) Foreign Application Priority Data

Dec. 31, 2002    (KR)    ............... 10-2002-0088427

(51) Int. Cl.
*H01J 1/62* (2006.01)
*H01J 63/04* (2006.01)

(52) U.S. Cl. .................. 313/504; 313/506; 313/512

(58) Field of Classification Search ............ 313/503, 313/504, 506, 512; 315/169.3; 257/40
See application file for complete search history.

(56) References Cited

U.S. PATENT DOCUMENTS

| | | | |
|---|---|---|---|
| 6,175,345 B1 | 1/2001 | Kuribayashi et al. | 345/76 |
| 6,215,244 B1 | 4/2001 | Kuribayashi et al. | 313/505 |
| 6,548,961 B2 | 4/2003 | Barth et al. | 315/169.3 |
| 6,788,278 B2 * | 9/2004 | Aoki | 345/82 |
| 6,815,903 B2 * | 11/2004 | Nakanishi | 315/169.3 |
| 6,919,680 B2 | 7/2005 | Shimoda et al. | 313/498 |
| 2001/0017372 A1 | 8/2001 | Koyama | 257/72 |
| 2002/0064966 A1 | 5/2002 | Seki et al. | 438/780 |
| 2002/0158577 A1 | 10/2002 | Shimoda et al. | 313/506 |

(Continued)

FOREIGN PATENT DOCUMENTS

EP    0 845 812 A2    6/1998

(Continued)

*Primary Examiner*—Nimeshkumar D. Patel
*Assistant Examiner*—Kevin Quarterman
(74) *Attorney, Agent, or Firm*—Morgan, Lewis & Bockius LLP (57) ABSTRACT

An organic electroluminescent device and methodology of fabricating the same includes first and second substrates facing and spaced apart from each other, the first and second substrates having a display region and a peripheral region, the display region including a plurality of pixel regions and a dummy pixel region; driving thin film transistors respectively adjacent to each of the plurality of pixel regions on the inner surface of the first substrate; first connection electrodes respectively connected to the driving thin film transistors; a first electrode on an entire inner surface of the second substrate; a sidewall on the first electrode at a boundary of each of the plurality of pixel regions and the dummy pixel region; an organic electroluminescent layer on the first electrode; second electrodes on the organic electroluminescent layer so that a second electrode is present in each of the plurality of pixel regions and the dummy pixel region, respectively, the second electrodes in each of the plurality of pixel regions are respectively connected to the first connection electrodes; and a sealant attaching the first and second substrates.

17 Claims, 12 Drawing Sheets

U.S. PATENT DOCUMENTS

| | | |
|---|---|---|
| 2002/0195961 A1 | 12/2002 | Barth et al. ............... 315/169.3 |
| 2003/0030766 A1 | 2/2003 | Kiguchi et al. ............. 349/106 |
| 2003/0142043 A1 | 7/2003 | Matsueda ................... 345/30 |
| 2003/0231149 A1 | 12/2003 | Kawamura et al. ........... 345/76 |

FOREIGN PATENT DOCUMENTS

| | | |
|---|---|---|
| EP | 1 096 303 A2 | 5/2001 |
| EP | 1 209 744 | 5/2002 |
| EP | 1 209 744 A2 | 5/2002 |
| JP | 4-031299 U | 3/1992 |
| JP | 09-171197 | 6/1997 |
| JP | 10-282528 | 10/1998 |
| JP | 11-008065 | 1/1999 |
| JP | 2000-082720 | 3/2000 |
| JP | 2000-162635 | 6/2000 |
| JP | 2000-206571 | 7/2000 |
| JP | 2001-117509 | 4/2001 |
| JP | 2001-177509 | 4/2001 |
| JP | 2001-282123 | 10/2001 |
| JP | 2001-318624 | 11/2001 |
| JP | 2002-082633 | 3/2002 |
| JP | 2002-222695 | 8/2002 |
| JP | 2004-213002 | 7/2004 |
| KR | 2002-0041301 | 6/2002 |
| KR | 2002-0047889 | 6/2002 |
| KR | 2004-0079476 | 9/2004 |
| WO | WO 01/62051 | 2/2001 |
| WO | WO 02/078101 | 10/2002 |
| WO | WO 02/099477 | 12/2002 |
| WO | WO-02/078101 | 10/2005 |

* cited by examiner

FIG. 1

*Related Art*

FIG. 2

Related Art

FIG. 3

Related Art

FIG. 4A

Related Art

FIG. 4B

Related Art

ORGANIC ELECTROLUMINESCENT DEVICE WITH PIXEL REGIONS AND DUMMY PIXEL REGIONS AND METHOD OF FABRICATING THE SAME

The present invention claims the benefit of the Korean Patent Application No. 2002-88427, filed in Korea on Dec. 31, 2002, which is hereby incorporated by reference.

BACKGROUND OF THE INVENTION

1. Field of the Invention

The present invention relates to an organic electroluminescent device, and more particularly, to a dual plate organic electroluminescent device that includes a first substrate having a thin film transistor array unit and a second substrate having an organic electroluminescent unit, and a method of fabricating the same.

2. Discussion of the Related Art

Generally, an organic electroluminescent device (ELD) emits light by injecting electrons from a cathode and holes from an anode into an emission layer, combining the electrons with the holes, generating an exciton, and transitioning the exciton from an excited state to a ground state. Unlike the case for a liquid crystal display (LCD) device, an additional light source is not necessary for the organic ELD to emit light because the transition of the exciton between states causes light to be emitted in the organic ELD arrangement. Accordingly, the size and weight of the organic ELD can be reduced. The organic ELD has other desirable characteristics, such as a low power consumption, superior brightness and fast response time. Because of these advantageous characteristics, the organic ELD is regarded as a promising candidate for various next-generation consumer electronic applications, such as cellular phones, car navigation systems (CNS), personal digital assistants (PDA), camcorders and palmtop computers. Moreover, because fabricating an organic ELD is a relatively simple process with few processing steps, it is much cheaper to produce an organic ELD than an LCD device.

Two different types of organic ELDs exist: passive matrix and active matrix. Even though passive matrix organic ELDs have a simple structure and are formed by a simple fabricating process, passive matrix organic ELDs require a relatively high amount of power to operate. In addition, the display size of passive matrix organic ELDs is limited by their structure. Furthermore, as the number of conductive lines increases, the aperture ratio of passive matrix organic ELDs will decrease. On the other hand, active matrix organic ELDs contrast with passive matrix organic ELDs in that the active matrix organic ELDs have a high emission efficiency and can produce high-quality images for a large display with relatively low power consumption.

Figure 1:
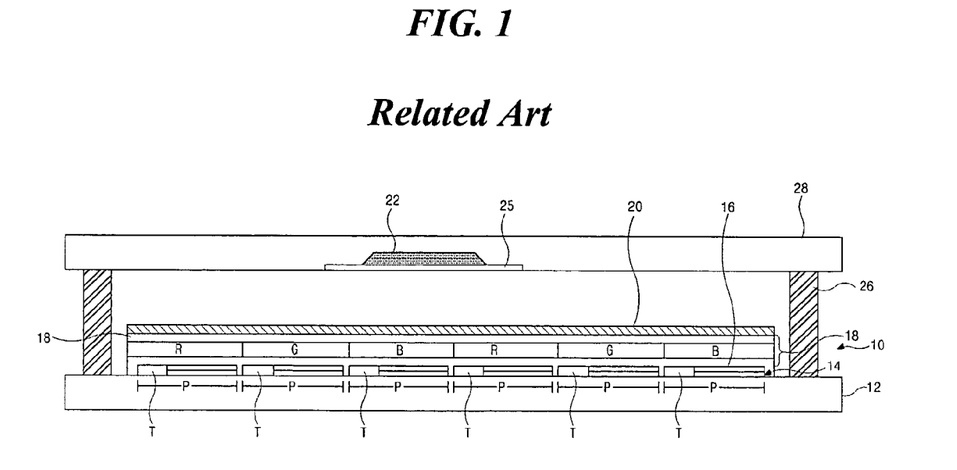
FIG. 1 is a schematic cross-sectional view of an organic electroluminescent device according to the related art.

FIG. 1 is a schematic cross-sectional view of an organic electroluminescent device according to the related art.

As shown in FIG. 1, an organic electroluminescent device (ELD) 10 includes first and second substrates 12 and 28 facing each other and spaced apart from each other. An array layer 14 including a thin film transistor (TFT) "T" is formed on an inner surface of the first substrate 12. A first electrode 16, an organic electroluminescent (EL) layer 18, and a second electrode 20 are sequentially formed on the array layer 14. The organic EL layer 18 may separately display red, green, and blue colors for each pixel region "P." Generally, separate organic materials are used to emit light of each color for the organic EL layer 18 in each pixel region "P." The organic ELD 10 is encapsulated by attaching the first substrate 12 and a second substrate 28, which includes a moisture absorbent desiccant 22, with a sealant 26. The moisture absorbent desiccant 22 eliminates moisture and oxygen that may penetrate into a capsule of the organic EL layer 18. After etching a portion of the second substrate 28, the etched portion is filled with the moisture absorbent desiccant 22 and the filled moisture absorbent desiccant 22 is fixed by a holding element 25.

Figure 2:
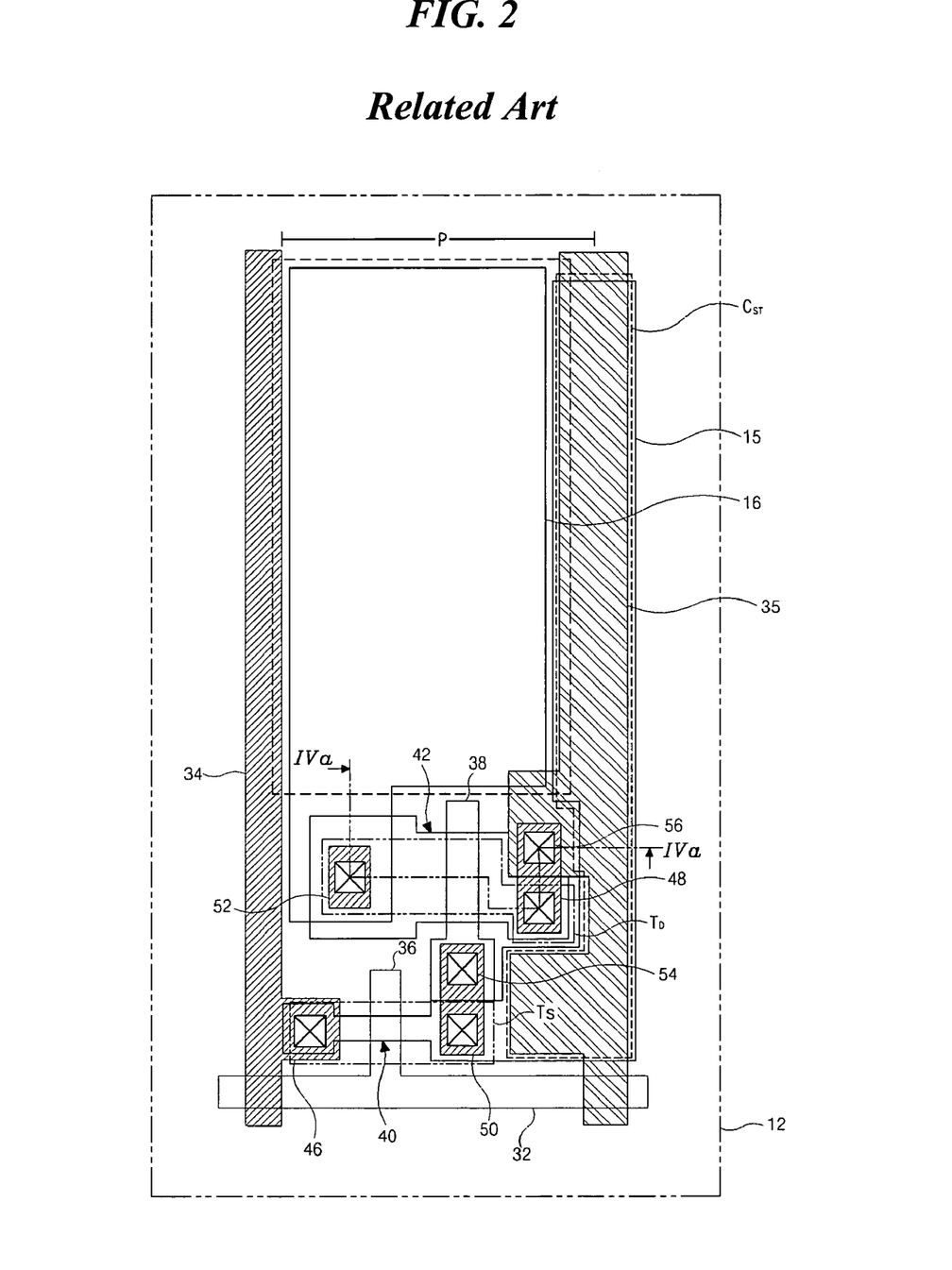
FIG. 2 is a schematic plane view showing an array layer of an organic electroluminescent device according to the related art.

FIG. 2 is a schematic plane view showing an array layer of an organic electroluminescent device according to the related art.

As shown in FIG. 2, an array layer of an organic electroluminescent device (ELD) includes a switching element "$T_S$," a driving element "$T_D$" and a storage capacitor "$C_{ST}$." The switching element "$T_S$" and the driving element "$T_D$" may include a combination of at least one thin film transistor (TFT). A transparent insulating substrate 12 on which the array layer is formed may be made of glass or plastic. A gate line 32 and a data line 34 crossing each other are formed on the substrate 12. A pixel region "P" is defined by the gate line 32 and the data line 34. An insulating layer (not shown) is interposed between the gate line 32 and the data line 34. A power line 35 parallel to and spaced apart from the data line 32 crosses the gate line 32.

The switching element "$T_S$" in FIG. 2 is a thin film transistor that includes a switching gate electrode 36, a switching active layer 40, a switching source electrode 46, and a switching drain electrode 50. Similarly, the driving element "$T_D$" in FIG. 2 is a thin film transistor that includes a driving gate electrode 38, a driving active layer 42, a driving source electrode 48, and a driving drain electrode 52. The switching gate electrode 36 is connected to the gate line 32 and the switching source electrode 46 is connected to the data line 34. The switching drain electrode 50 is connected to the driving gate electrode 38 through a first contact hole 54. The driving source electrode 48 is connected to the power line 35 through a second contact hole 56. Moreover, the driving drain electrode 52 is connected to a first electrode 16 at the pixel region "P." The power line 35 overlaps a first capacitor electrode 15 with the insulating layer interposed therebetween to form the storage capacitor "$C_{ST}$."

Figure 3:
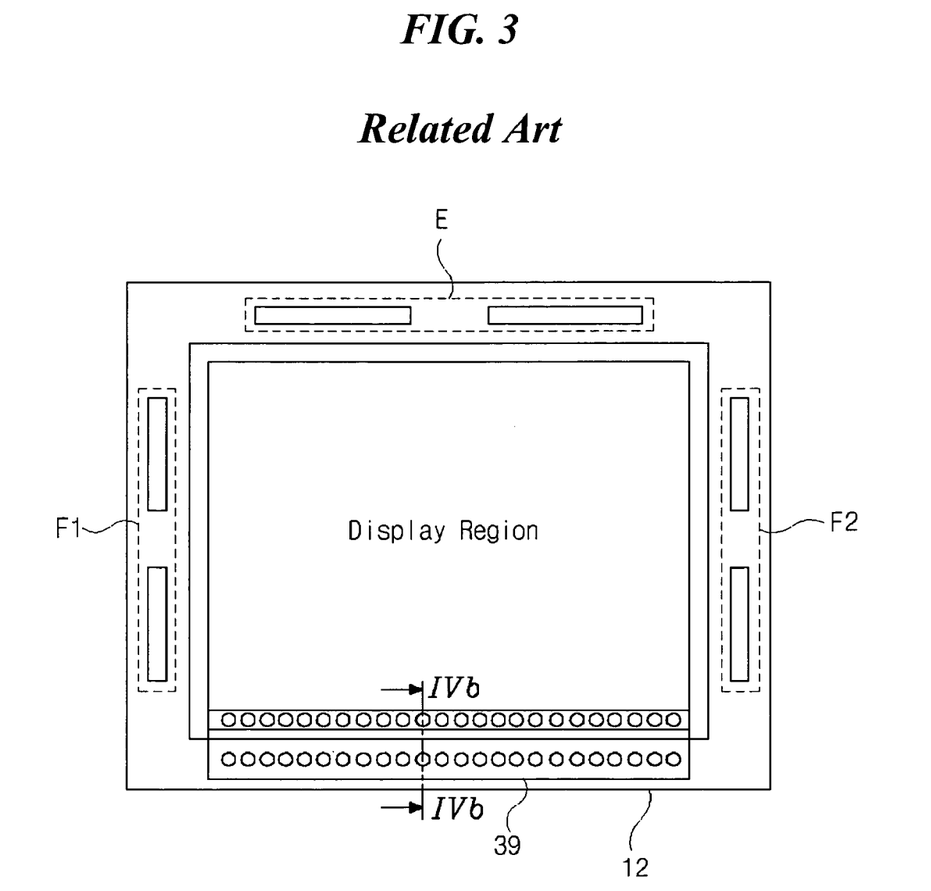
FIG. 3 is a schematic plane view showing an organic electroluminescent device according to the related art.

FIG. 3 is a schematic plane view showing an organic electroluminescent device according to an arrangement of the related art.

As shown in FIG. 3, a substrate 12 includes a data pad region "E" at a first side and first and second gate pad regions "F1" and "F2" at second and third sides adjacent to the first side. A common electrode 39 is formed at a fourth side facing the first side and adjacent to the second and third sides of the substrate 12. A common voltage is applied to a second electrode 20 through the common electrode 39 to maintain an electrical potential of the second electrode 20.

Figure 4A:
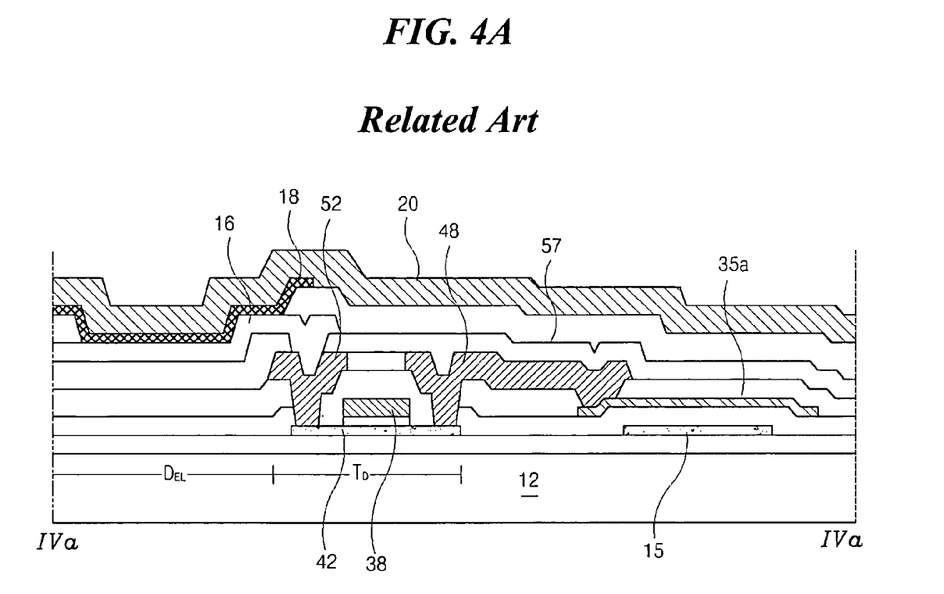
FIG. 4A is a schematic cross-sectional view taken along a line "IVa—IVa" of FIG. 2.
Figure 4B:
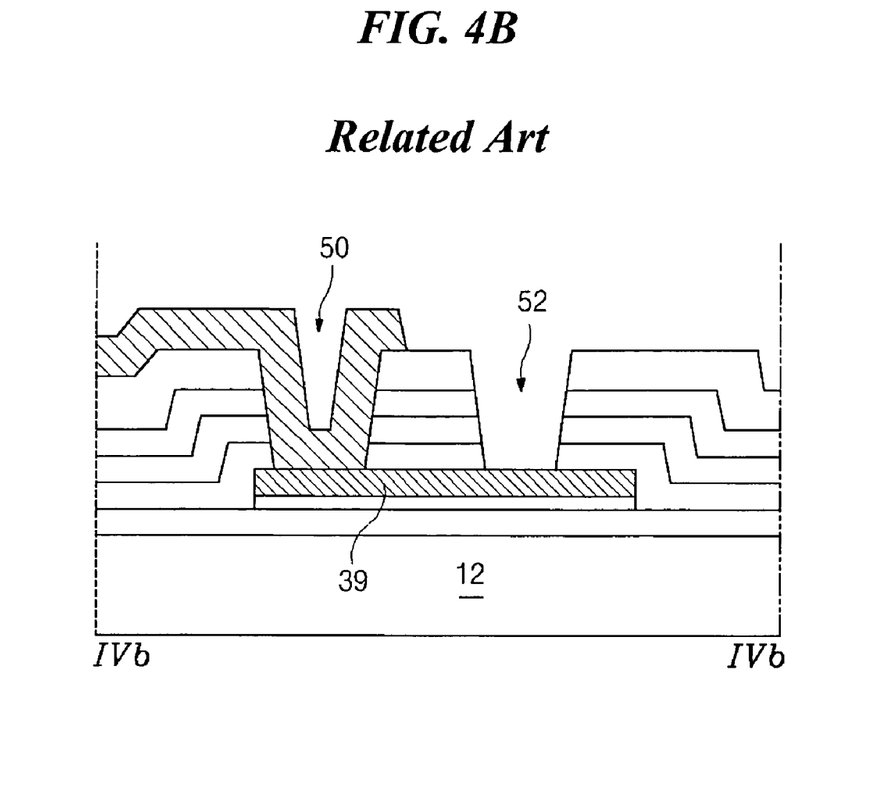
FIG. 4B is a schematic cross-sectional view taken along a line "IVb—IVb" of FIG. 3.

FIG. 4A is a schematic cross-sectional view taken along a line "IVa—IVa" of FIG. 2 and FIG. 4B is a schematic cross-sectional view taken along a line "IVb—IVb" of FIG. 3.

In FIGS. 4A and 4B, a driving thin film transistor (TFT) "$T_D$" including a driving active layer 42, a driving gate electrode 38, a driving source electrode 48, and driving drain electrode 52 is formed on a substrate 12. An insulating layer 57 is formed on the driving TFT "$T_D$" and a first electrode 16 connected to the driving drain electrode 52 is formed on the insulating layer 57. An organic electroluminescent (EL) layer 18 for emitting light of a specific color is formed on the first electrode 16, and a second electrode 20 is formed on the organic EL layer 18. The first and second electrodes 16 and 20 together with the organic EL layer 18 interposed therebetween constitute an organic electroluminescent (EL) diode "$D_{EL}$". A storage capacitor "$C_{ST}$" situated to be electrically parallel with the driving TFT "$T_D$" includes first and second capacitor electrodes 15 and 35a. A portion of a power line 35 (of FIG. 2) overlapping the first capacitor electrode 15 is used as the second capacitor electrode 35a. The second capacitor electrode 35a is connected to the driving source electrode 56. The second electrode 20 is formed over an entire surface of the substrate 12 including the driving TFT "$T_D$," the storage capacitor "$C_{ST}$," and the organic EL layer 18.

A common electrode 39 through which a common voltage is applied to the second electrode 20 is formed at a peripheral portion of the substrate 12. The common electrode 39 is simultaneously formed with the switching gate electrode 36 (of FIG. 2) and the driving gate electrode 38. A plurality of insulating layers on the common electrode 39 include first and second common contact holes 50 and 52, which expose the common electrode 39. The second electrode 20 is connected to the common electrode 39 through the first common contact hole 50. An external circuit (not shown) is connected to the common electrode 39 through the second common contact hole 52 to supply the common voltage.

However, when an array layer of TFTs and organic EL diodes are formed together on one substrate, a production yield of an organic ELD is determined by a multiplication of TFT's yield and organic EL layer's yield. Since organic EL layer's yield is relatively low, the production yield of an ELD is limited by the organic EL layer's yield. For example, even when a TFT is well fabricated, an organic ELD can be judged as being bad due to defects of an organic EL layer using a thin film of about 1000 Å thickness. This limitation causes loss of materials and rise in production cost.

Organic ELDs are classified as being a bottom emission type or a top emission type according to a transparency of the first and second electrodes and of the organic EL diode. The bottom emission type ELDs are advantageous for their high image stability and variable fabrication processing due to encapsulation. However, the bottom emission type organic ELDs are not adequate for implementation in devices that require high resolution due to the limitations of the increased aperture ratio in that type of organic ELDs. On the other hand, since top emission type organic ELDs emit light in a direction upward of the substrate, the light can be emitted without influencing the array layer that is positioned under the organic EL layer. Accordingly, the overall design of the array layer including TFTs may be simplified. In addition, the aperture ratio can be increased, thereby increasing the operational life span of the organic ELD. However, since a cathode is commonly formed over the organic EL layer in the top emission type organic ELDs, material selection and light transmittance are limited such that light transmission efficiency is lowered. If a thin film type passivation layer is formed to prevent a reduction of the light transmittance, the thin film type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device that is fabricated by forming an array layer and an organic electroluminescent diode on respective substrates and attaching the substrates, and a method of fabricating the same.

An advantage of the present invention is to provide an organic electroluminescent device that includes a first connection electrode in a display region and a second connection electrode in a peripheral region, and a method of fabricating the same.

Another advantage of the present invention is to provide an organic electroluminescent device that has a high aperture ratio, a high display quality, and improved production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes: first and second substrates facing and spaced apart from each other, the first and second substrates having a display region and a peripheral region, the display region including a plurality of pixel regions and a dummy pixel region; driving thin film transistors respectively adjacent to each of the plurality of pixel regions on the inner surface of the first substrate; first connection electrodes respectively connected to the driving thin film transistors; a first electrode on an entire inner surface of the second substrate; a sidewall on the first electrode at a boundary of each of the plurality of pixel regions and the dummy pixel region; an organic electroluminescent layer on the first electrode; second electrodes on the organic electroluminescent layer so that a second electrode is present in each of the plurality of pixel regions and the dummy pixel region, respectively, the second electrodes in each of the plurality of pixel regions are respectively connected to the first connection electrodes; and a sealant attaching the first and second substrates.

In another aspect, a method of fabricating an organic electroluminescent device includes: forming a first substrate having a display region and a peripheral region, the display region including a plurality of pixel regions and a dummy pixel region; forming driving thin film transistors respectively adjacent to each of the plurality of pixel regions; forming first connection electrodes respectively connected to the driving thin film transistors; forming a first electrode on a second substrate having the display region and the peripheral region; forming a sidewall on the first electrode at a boundary of each of the plurality of pixel regions and the dummy pixel region; forming an organic electroluminescent layer on the first electrode; forming second electrodes on the organic electroluminescent layer so that a second electrode is formed in each of the plurality of pixel regions and the dummy pixel region, respectively; and attaching the first and second substrates with a sealant such that the first connection electrodes contact the second electrodes.

In another aspect, a method of fabricating an organic electroluminescent device includes: forming a first insulating layer on a first substrate having a display region and a peripheral region, the display region including a plurality of pixel regions and a dummy pixel region; forming an active layer on the first insulating layer at each of the plurality of pixel regions, the active layer including polycrystalline silicon, the active layer having source and drain regions; forming a second insulating layer on the active layer; forming a gate electrode on the second insulating layer over the active layer; forming a third insulating layer on the gate electrode; forming a fourth insulating layer on the third insulating layer, the fourth insulating layer having first and second contact holes, the first contact hole exposing the source region, the second contact hole exposing the drain region; forming source and drain electrodes on the fourth insulating layer, the source electrode being connected to the source region through the first contact hole, and the drain electrode being connected to the drain region through the second contact hole; forming a fifth insulating layer on the source and drain electrodes, the fifth insulating layer having a third contact hole exposing the drain electrode; forming a first connection electrode on the fifth insulating layer, the first connection electrode being connected to the drain electrode through third contact hole; forming a first electrode on a second substrate having the display region and the peripheral region; forming a sidewall on the first electrode at a boundary of each of the plurality of pixel regions and the dummy pixel region; forming an organic electroluminescent layer on the first electrode; forming a second electrode on the organic electroluminescent layer in each of the plurality of pixel regions; and attaching the first and second substrates with a sealant such that the first connection electrode contacts the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments of the present invention, examples of which are illustrated in the accompanying drawings.

Figure 5:
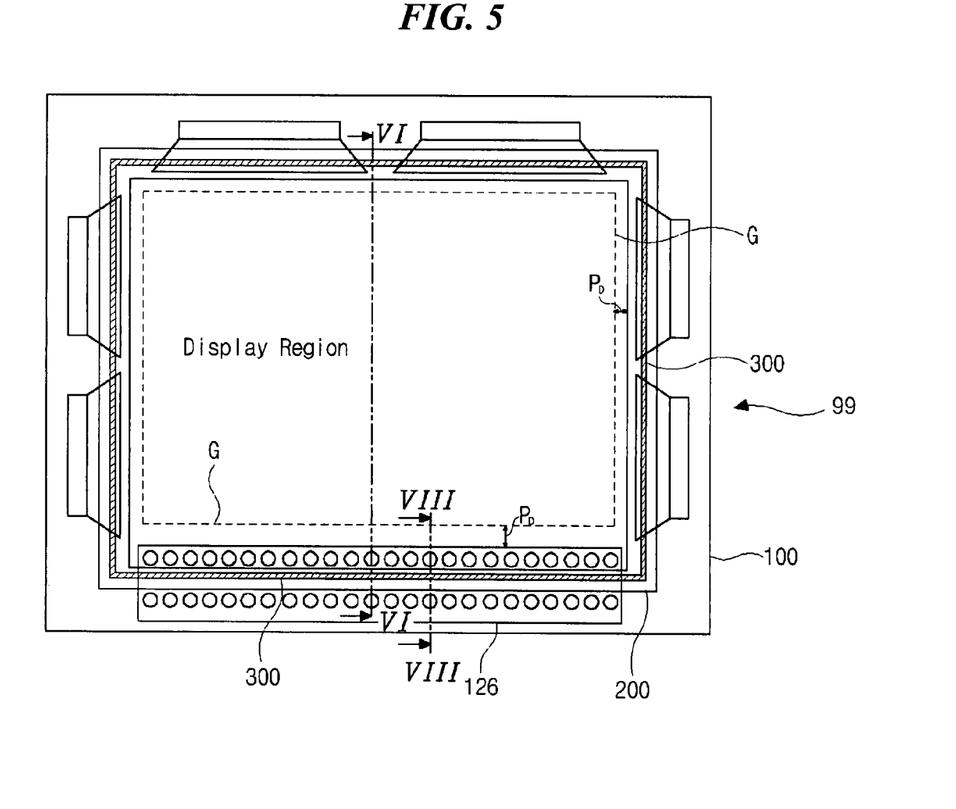
FIG. 5 is a schematic plane view showing an organic electroluminescent device according to an embodiment of the present invention.

FIG. 5 is a schematic plane view showing an organic electroluminescent device according to an embodiment of the present invention.

In FIG. 5, an organic electroluminescent device (ELD) 99 includes a first substrate 100 having an array layer and a second substrate 200 having an organic electroluminescent (EL) diode. The first and second substrates 100 and 200 are attached with a sealant 300. A pad 126, to which a voltage is supplied, is formed at a peripheral region of the first substrate 100 to cross the sealant 300. A dummy pixel region "$P_D$" is disposed adjacent to a boundary "G" of a display region to surround the display region. Switching and driving elements are not formed on the portion of the first substrate 100 corresponding to the dummy pixel region "$P_D$."

Figure 6A:
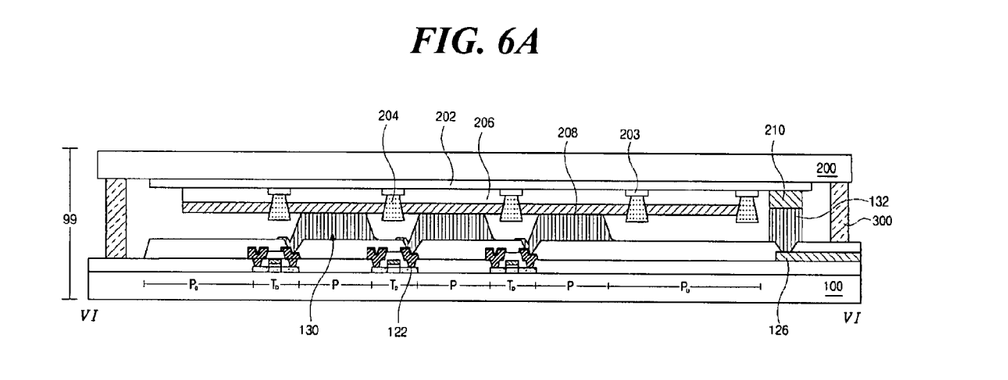
FIG. 6 is a schematic cross-sectional view, taken along line "VI—VI" of FIG. 5.
Figure 6B:
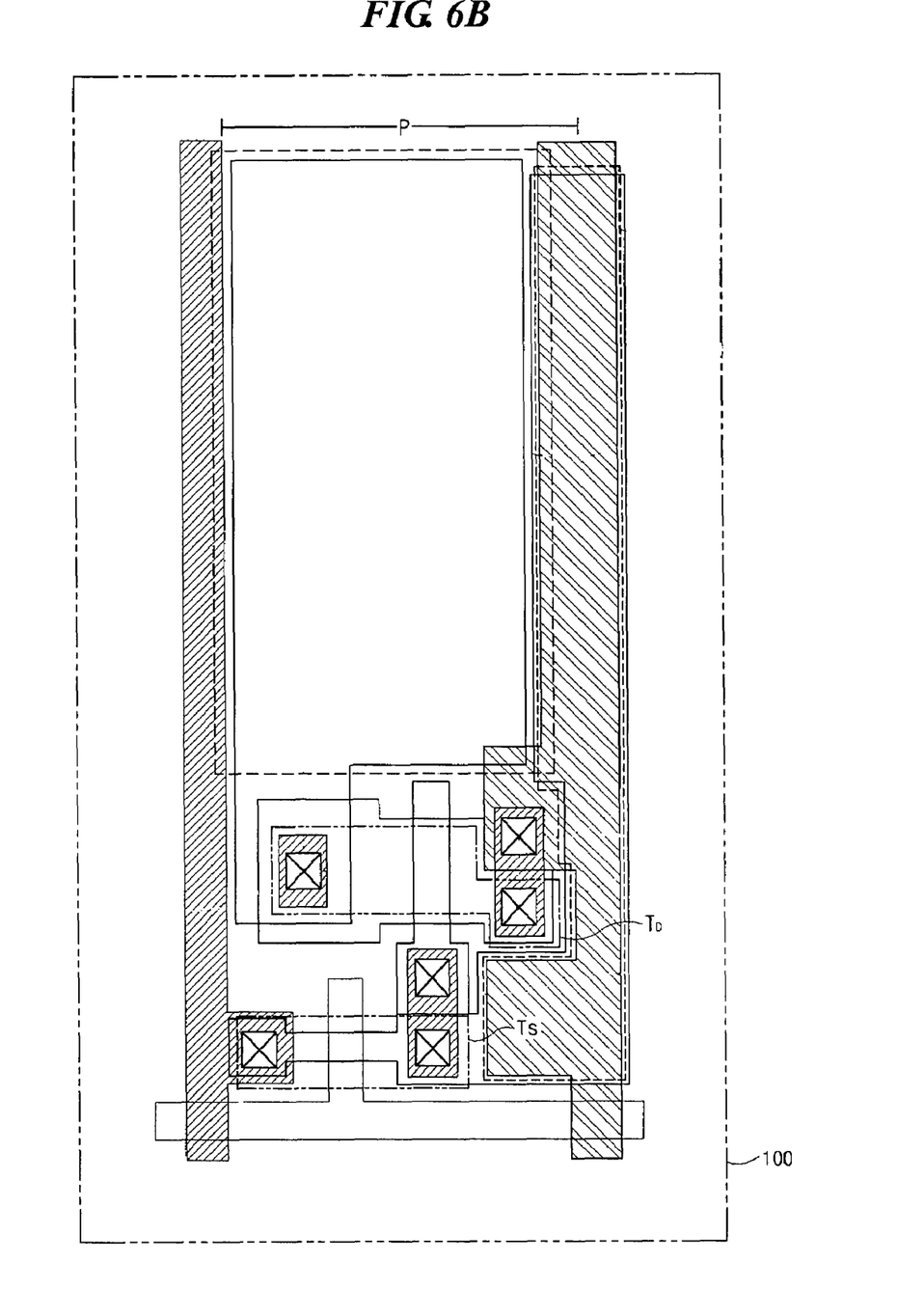
FIG. 6B is a schematic plane view showing an organic electroluminescent device according to an embodiment of the present invention.

FIG. 6A is a schematic cross-sectional view, taken along line "VI—VI" of FIG. 5, and FIG. 6B is a schematic plane view showing an array layer of an organic electroluminescent device according to an embodiment of the present invention.

In FIG. 6A, an organic electroluminescent device (ELD) 99 is fabricated by attaching first and second substrates 100 and 200 with a sealant 300. The first and second substrates 100 and 200 include a plurality of pixel regions "P" and dummy pixel regions "$P_D$" surrounding the plurality of pixel regions "P." A switching thin film transistor (TFT) "Ts" (shown in FIG. 6B) and a driving TFT "$T_D$" are formed on an inner surface of the first substrate 100 adjacent to each pixel region "P." Even though not shown in FIG. 6, a plurality of array lines are formed on the inner surface of the first substrate 100. A first electrode 202 is formed on an inner surface of the second substrate 200. A sidewall 204 is formed on the first electrode 202 at a boundary of each pixel region "P" to surround each pixel region "P." An organic electroluminescent layer 206 and a second electrode 208 are sequentially formed on the first electrode 202 in each pixel region "P." An auxiliary pattern 203 may be formed between the first electrode 202 and the sidewall 204.

The second electrodes 208 are each indirectly connected respectively to a driving drain electrodes 122 of the driving TFT "$T_D$" through first connection electrodes 130, respectively. After the first connection electrode 130 is formed over the driving TFT "$T_D$" to contact the driving drain electrode 122, the first connection electrode 130 contacts the second electrode 208 on the organic EL layer 206 by attaching the first and second substrates 100 and 200. A pad 126 is formed in a peripheral region of the first substrate 100. A second connection electrode 132 is formed on the pad 126 to contact the first electrode 202 on the second substrate 200. When the first electrode 202 can be made of a transparent conductive material, the first electrode 202 has a relatively high resistance. Accordingly, an auxiliary electrode 210 can be formed on the first electrode 202 when the first electrode 202 is made of a transparent conductive material. The auxiliary electrode 210 may be made of the same material as the second electrode 208.

As shown in FIG. 6A, for example, a dummy pixel region "$P_D$" is disposed between the peripheral region where the pad 126 is formed and a pixel region "P." The switching TFT (not shown), the driving TFT "$T_D$" and the first connection electrode 130 are not formed on the portion of the first substrate 100 corresponding to the dummy pixel region "$P_D$." As a result, the second electrode 208 in the dummy pixel region "$P_D$" is electrically floating. Because of this arrangement, the organic EL diode can function normally even when the first electrode 202 contacts the second electrode 208 in the dummy pixel region "$P_D$" due to a fabricating error.

FIGS. 7A to 7D and FIGS. 8A to 8D are schematic cross-sectional views showing a fabricating process of an organic electroluminescent device according to an embodiment of the present invention. FIGS. 7A to 7D, which are views taken along a cross-sectional line showing a fabrication process of a pixel region of a first substrate for an organic electroluminescent device according to an embodiment of the present invention along a cross-section line comparable to cross-sectional line "IVa—IVa" of FIG. 2, illustrate a fabricating process of a pixel region of a first substrate for an organic electroluminescent device. FIGS. 8A to 8D, which are views taken along a line "VIII—VIII" of FIG. 5, illustrate a fabricating process of a dummy pixel region of a first substrate for an organic electroluminescent device.

Figure 7A:
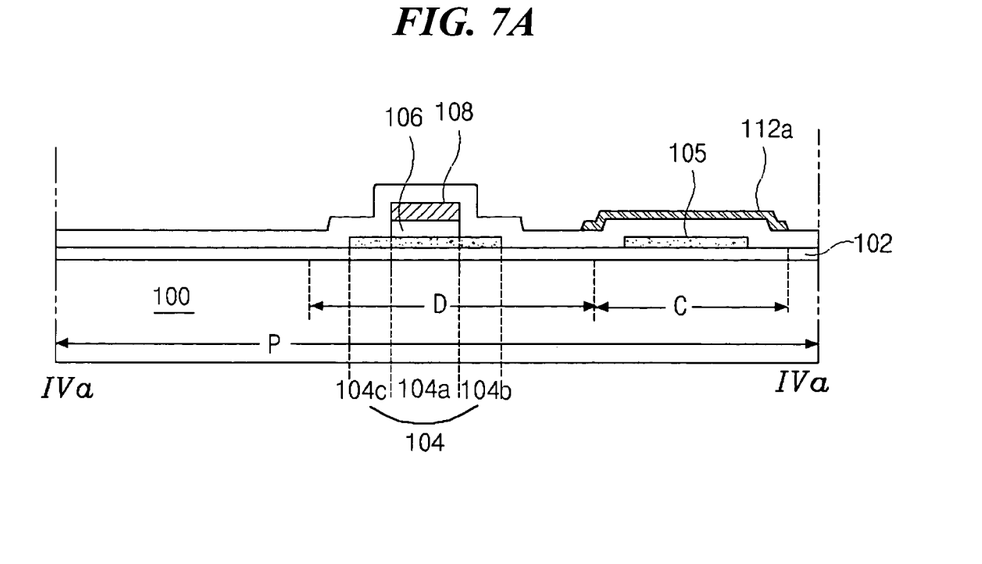
FIGS. 7A to 7D are schematic cross-sectional views showing a fabricating process of a pixel region of a first substrate for an organic electroluminescent device according to an embodiment of the present invention along a cross-section line comparable to cross-section line "IVa—IVa" of FIG. 2.
Figure 8A:
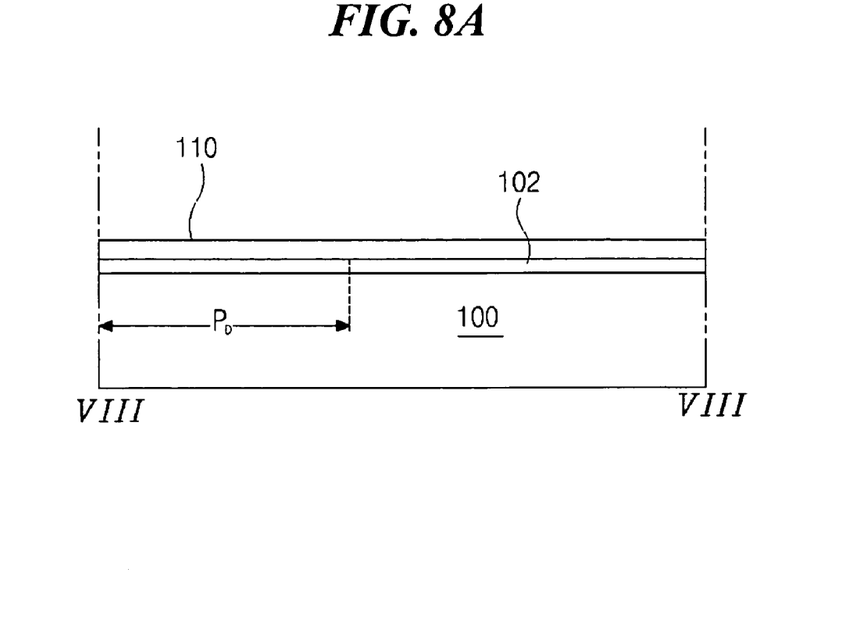
FIGS. 8A to 8D, which are taken along a line "VIII—VIII" of FIG. 5, are schematic cross-sectional views showing a fabricating process of a dummy pixel region of a first substrate for an organic electroluminescent device.

In FIG. 7A, a first substrate 100 including a pixel region "P" is illustrated. In FIG. 8A, a dummy pixel region "$P_D$" is illustrated which is located adjacent to a boundary of a display region including the pixel region "P." The pixel region "P" includes a switching region (not shown), a driving region (D) and a storage region (C). A first insulating layer (a buffer layer) 102 is formed on an entire surface of the first substrate 100 by depositing one selected from a silicon insulating material group including silicon nitride ($SiN_x$) and silicon oxide ($SiO_2$). First and second active layers 104 and 105 of polycrystalline silicon are formed on the buffer layer 102 at the driving and storage regions "D" and "C," respectively. For example, the first and second active layers 104 and 105 can be formed through a dehydrogenation process and a crystallization process by applying heat after deposition of amorphous silicon. The second active layer 105 functions as a first electrode of a storage capacitor by doping with impurities.

A second insulating layer 106 (a gate insulating layer) and a gate electrode 108 are sequentially formed on the first active layer 104. The second insulating layer 106 can be formed on an entire surface of the first substrate 100. The second insulating layer 106 may be made of one of an inorganic insulating material group including silicon nitride ($SiN_x$) and silicon oxide ($SiO_2$). After forming the gate electrode 108, the first active layer 104 is doped with impurities such as boron (B) or phosphorus (P) to define a channel region 104a, and source and drain regions 104b and 104c. A third insulating layer 110 (an interlayer insulating layer) is formed on the gate electrode 108. The gate electrode 108 may be made of one of a conductive metallic material group including aluminum (Al), aluminum (Al) alloy, copper (Cu), tungsten (W), tantalum (Ta) and molybdenum (Mo). The third insulating layer 110 may be made of one of an inorganic insulating material group including silicon nitride ($SiN_x$) and silicon oxide ($SiO_2$). A power line (not shown) is formed on the third insulating layer 110 to overlap the second active layer 105. A portion of the power line overlapping the second active layer 105 functions as a capacitor electrode 112a. The capacitor electrode 112a is formed on the third insulating layer 110 at the storage region "C" by depositing and patterning one of a conductive metallic material group including aluminum (Al), aluminum (Al) alloy, copper (Cu), tungsten (W), tantalum (Ta) and molybdenum (Mo). The second active layer 105 and the capacitor electrode 112a overlapping the second active layer 105 constitute a storage capacitor with the third insulating layer 110 interposed therebetween.

Figure 7B:
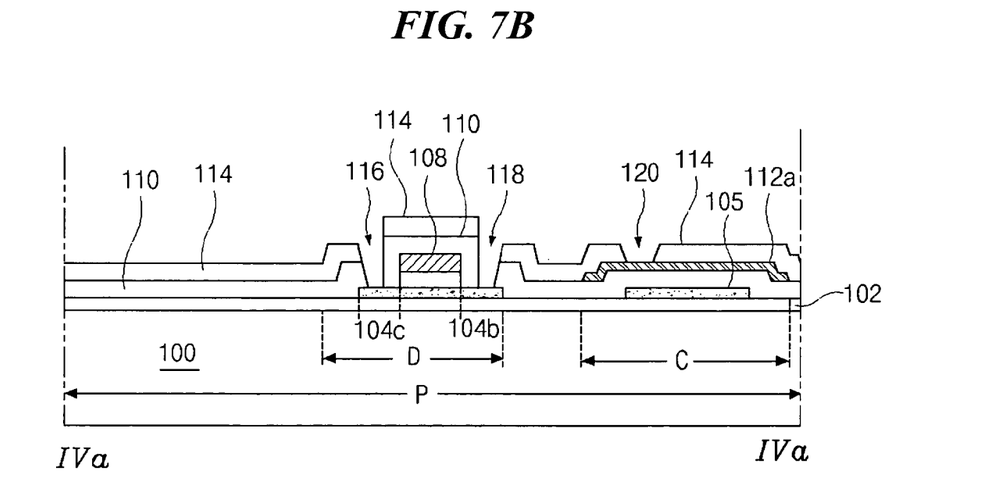
Figure 8B:
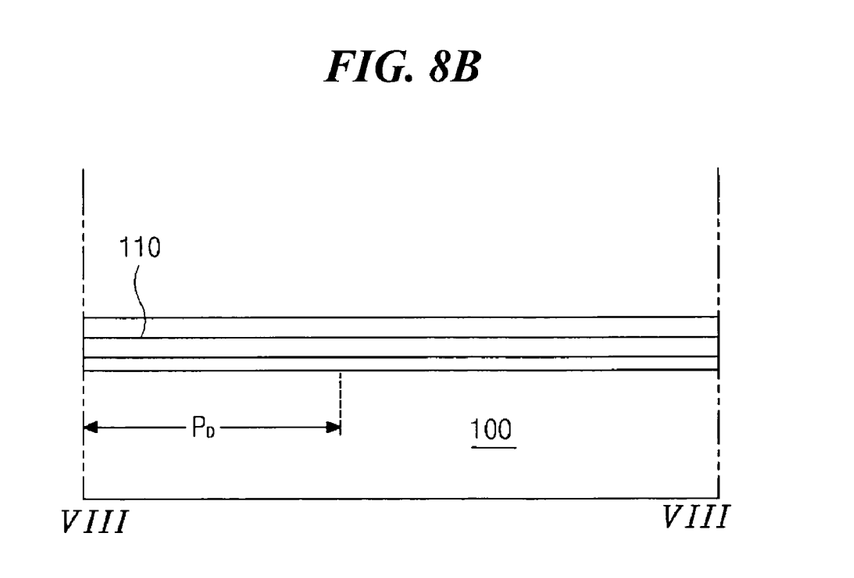

In FIGS. 7B and 8B, a fourth insulating layer 114 is formed on the power line including the capacitor electrode 112a. The fourth insulating layer 114 includes a first contact hole 116 exposing the drain region 104c, a second contact hole 118 exposing the source region 104b, and a third contact hole 120 exposing the capacitor electrode 112a.

Figure 7C:
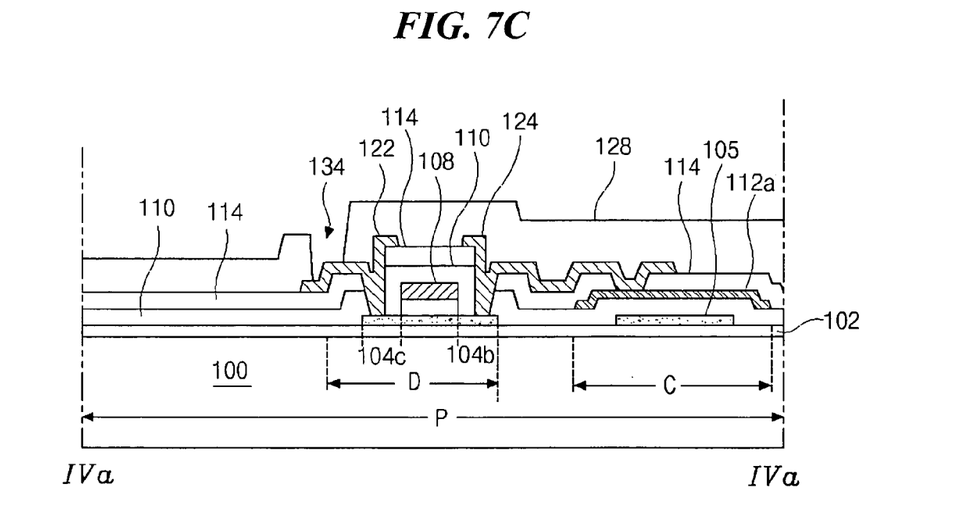
Figure 8C:
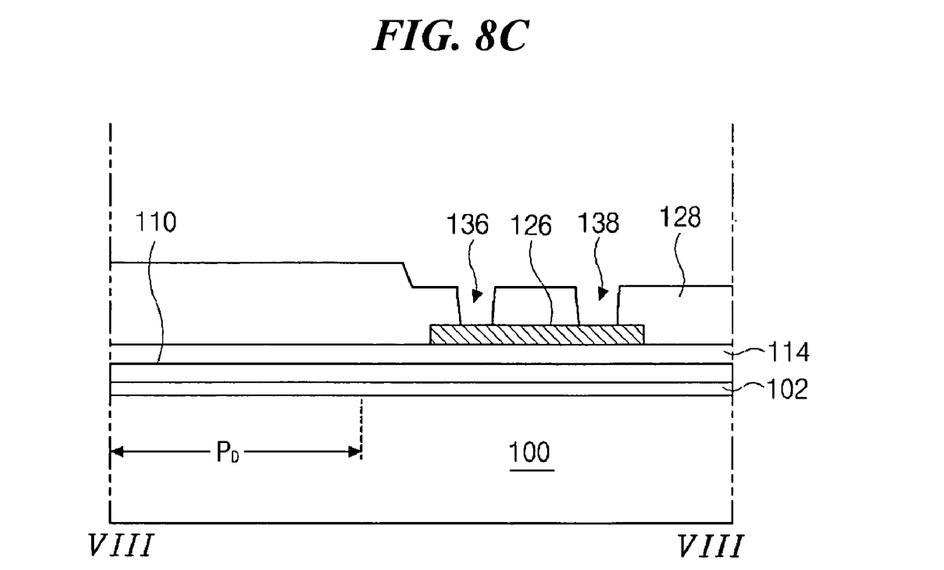

In FIGS. 7C and 8C, source and drain electrodes 124 and 122 are formed on the fourth insulating layer 114 by depositing and patterning one of a conductive metal group including chromium (Cr), molybdenum (Mo), tantalum (Ta) and tungsten (W). The source electrode 124 contacts the source region 104b through the second contact hole 118 and the drain electrode 122 contacts the drain region 104c through the first contact hole 116. At the same time, a pad 126 is formed on the fourth insulating layer 114 at a peripheral region of the display region including the pixel region "P." A fifth insulating layer 128 including fourth, fifth and sixth contact holes 134, 136 and 138 is formed on the source and drain electrodes 124 and 122 and the first pad 126. The fourth contact hole 134 exposes the drain electrode 122 and the fifth and sixth contact holes 136 and 138 expose both sides of the pad 126.

Figure 7D:
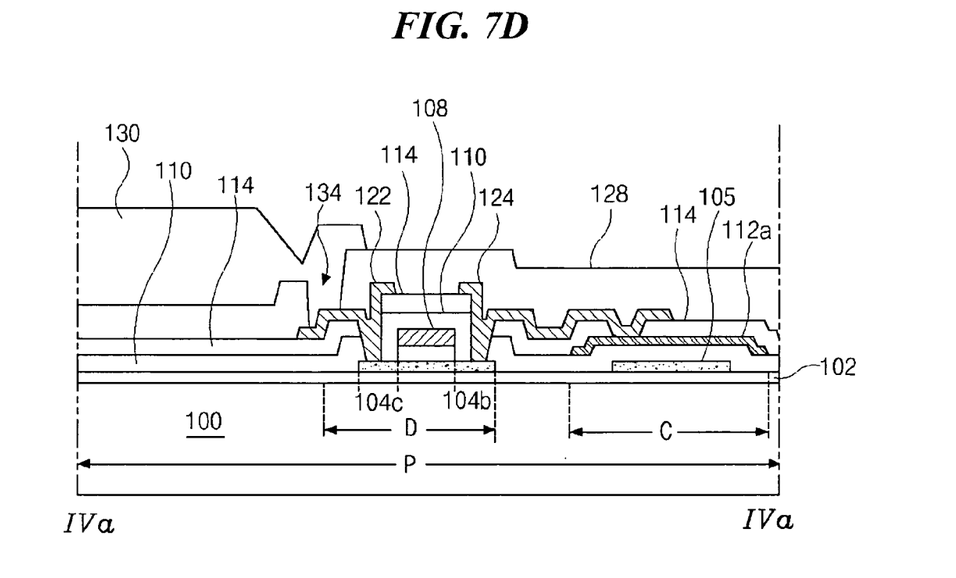
Figure 8D:
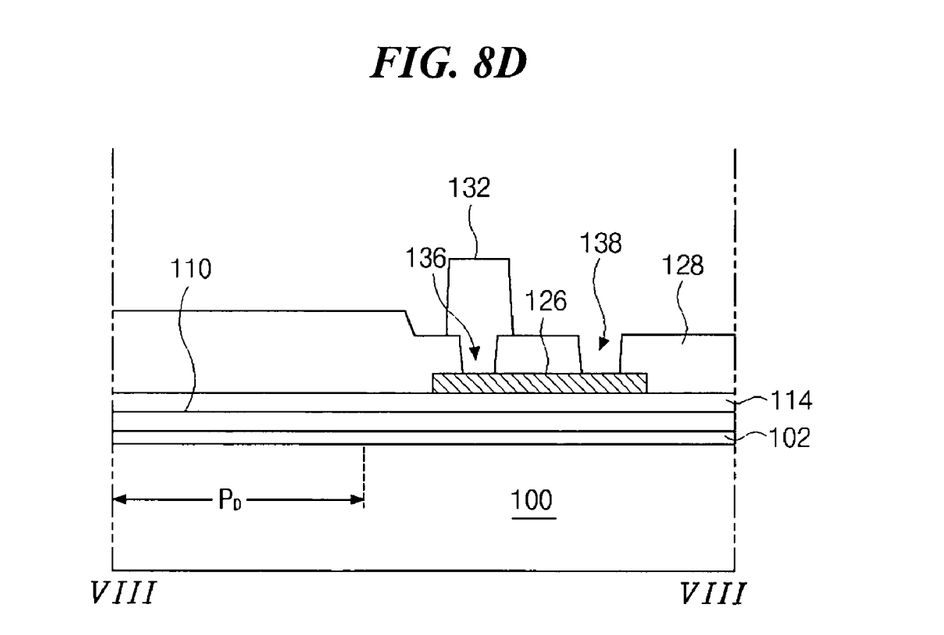

In FIGS. 7D and 8D, first and second connection electrodes 130 and 132 are formed on the fifth insulating layer 128 by depositing and patterning a conductive metallic material. The first connection electrode 130 contacts the drain electrode 122 through the fourth contact hole 134 and is disposed at the pixel region "P." The second connection electrode 132 contacts the pad 126 through the fifth contact hole 136.

In FIGS. 8A to 8D, neither a switching TFT nor a driving TFT is formed in the dummy pixel region "$P_D$." Only insulating layers are formed in the dummy pixel region "$P_D$."

Figure 9A:
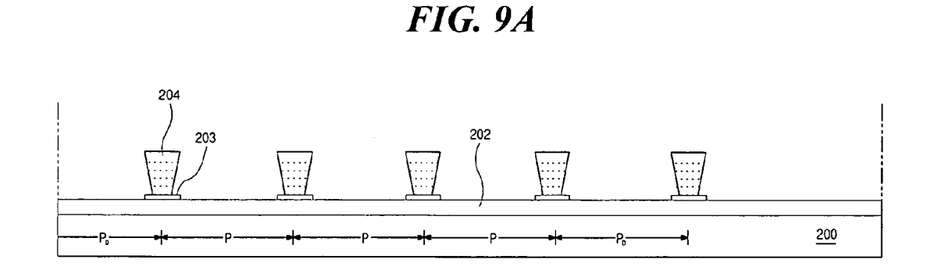
FIGS. 9A to 9C are schematic cross-sectional views showing a fabricating process of a second substrate for an organic electroluminescent device according to an embodiment of the present invention.
Figure 9B:
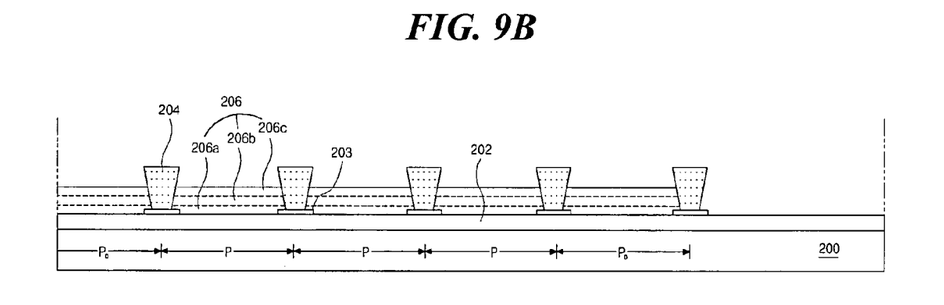
Figure 9C:
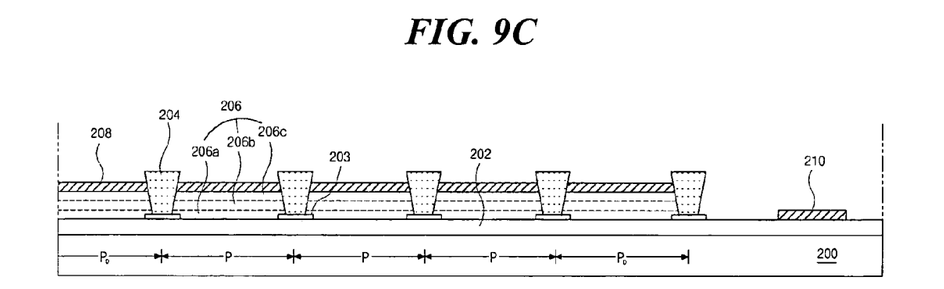

FIGS. 9A to 9C are schematic cross-sectional views showing a fabricating process of a second substrate for an organic electroluminescent device according to an embodiment of the present invention.

In FIG. 9A, a second substrate 200 includes a pixel region "P" and a dummy pixel region "$P_D$." A first electrode 202 is formed on the second substrate 200. The first electrode 202 may function as an anode injecting holes into an organic electroluminescent (EL) layer 206 (of FIG. 9B). For example, the first electrode 202 may be made of one of indium-tin-oxide (ITO) or indium-zinc-oxide (IZO). An auxiliary insulating pattern 203 is formed on the first electrode 202 at a boundary of the pixel region "P" and a sidewall 204 is formed on the auxiliary insulating pattern 203. The auxiliary insulating pattern 203 is formed to prevent contact of the first electrode 202 and a second electrode 208 (of FIG. 8C). The sidewall 204 may be formed by depositing and patterning a photosensitive organic material. The auxiliary insulating pattern 203 and the sidewall 204 are formed, for example, in a lattice.

In FIG. 9B, an organic electroluminescent (EL) layer 206 is formed on the first electrode 202. The organic EL layer 206 emitting one of red (R), green (G) and blue (B) colored lights corresponds to one pixel region "P." The organic EL layer 206 may include a single layer or a multiple layer. In case of a multiple layer, the organic EL layer 206 may include a hole transporting layer (HTL) 206a, an emission layer 206b and an electron transporting layer (ETL) 206c.

In FIG. 9C, a second electrode 208 corresponding to one pixel region "P" is formed on the organic EL layer 206. The second electrode 208 is independent of the adjacent second electrode 208. An auxiliary electrode 210 is simultaneously formed with the second electrode 208 in a peripheral region of a display region including the pixel region "P." The auxiliary electrode 210 is electrically floating, i.e., is not electrically connected to the second electrode 208. The second electrode 208 may function as a cathode injecting electrons into the organic EL layer 206. For example, the second electrode 208 may include a single layer of aluminum (Al), calcium (Ca) or magnesium (Mg), or a double layer of lithium fluoride (LiF)/aluminum (Al). The second electrodes 208 may have a lower work function than the first electrode 202.

An organic ELD of the present invention includes a dummy pixel region surrounding a display region having a pixel region. A sidewall is formed at a boundary of the dummy pixel region. Neither a switching TFT nor a driving TFT is formed in the dummy pixel region. A second electrode is independently formed in the pixel region. In addition, the second electrode in the dummy pixel region is not electrically connected to the driving TFT and electrically floating. Accordingly, the organic ELD can function normally even when a first electrode of an organic EL diode contacts a second electrode of the organic EL diode in the dummy pixel region due to a process error.

The organic ELD arrangement of the present invention results in particular advantages. First, since the organic ELD is a top emission type, a high aperture ratio can be obtained. Second, since an array layer including a thin film transistor and an organic EL diode are independently formed on respective substrates, undesired effects due to a fabricating process of the organic EL diode can be prevented, thereby improving the overall production yield. Third, because a dummy pixel region, where neither a switching TFT nor a driving TFT are formed, is disposed at a boundary of a display region, a first electrode is not electrically connected to a second electrode. The dummy pixel region provides an align margin for a mask process of the second electrode. Accordingly, contact property and production yield are improved and signal distortion is prevented.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
 first and second substrates facing and spaced apart from each other, the first and second substrates having a display region and a peripheral region, the display region including a plurality of pixel regions and a dummy pixel region;
 driving thin film transistors respectively adjacent to each of the plurality of pixel regions on the inner surface of the first substrate;
 first connection electrodes respectively connected to the driving thin film transistors;
 a first electrode on an entire inner surface of the second substrate;
 a sidewall on the first electrode at a boundary of each of the plurality of pixel regions and the dummy pixel region;
 an organic electroluminescent layer on the first electrode;
 second electrodes on the organic electroluminescent layer so that a second electrode is present in each of the plurality of pixel regions and the dummy pixel region, respectively, the second electrodes in each of the plurality of pixel regions are respectively connected to the first connection electrodes; and
 a sealant attaching the first and second substrates.

2. The device according to claim 1, further comprising:
 a pad in the peripheral region on an inner surface of the first substrate; and
 a second connection electrode connected to the pad, the second connection electrode formed in the same layer and formed of the same material as the first connection electrodes,
 wherein the first electrode is connected to the second connection electrode.

3. The device according to claim 1, wherein the second electrode in the dummy pixel region is electrically floating.

4. The device according to claim 1, wherein each of the driving thin film transistors includes a driving active layer, a driving gate electrode, and driving source and driving drain electrodes.

5. The device according to claim 2, wherein each of the driving thin film transistors includes a driving active layer, a driving gate electrode, and driving source and driving drain electrodes, and wherein the pad includes the same material as the driving source and driving drain electrodes.

6. The device according to claim 4, further comprising switching thin film transistors connected to the driving thin film transistors, wherein each of the switching thin film transistors includes a switching active layer, a switching gate electrode, and switching source and switching drain electrodes.

7. The device according to claim 6, wherein the driving active layer and the switching active layer include polycrystalline silicon.

8. The device according to claim 6, wherein the switching source electrode is connected to a data line, wherein the switching drain electrode is connected to the driving gate electrode, wherein the switching gate electrode is connected to the gate line.

9. The device according to claim 1, further comprising a power line connected to the driving thin film transistors.

10. The device according to claim 1, further comprising storage capacitors connected to the driving thin film transistors.

11. The device according to claim 1, wherein the first electrode is an anode injecting holes into the organic electroluminescent layer, and wherein the second electrodes are cathodes injecting electrons into the organic electroluminescent layer.

12. The device according to claim 11, wherein the first electrode includes one of indium-tin-oxide (ITO) and indium-zinc-oxide (IZO).

13. The device according to claim 11, wherein the second electrodes include one of calcium (Ca), aluminum (Al) and magnesium (Mg).

14. The device according to claim 2, further comprising an auxiliary electrode between the first electrode and the second connection electrode, wherein the auxiliary electrode includes the same material as the second electrodes.

15. The device according to claim 1, wherein the dummy pixel region surrounds the plurality of pixel regions.

16. The device according to claim 1, further comprising an auxiliary insulating layer between the first electrode and at least one of the sidewalls.

17. The device according to claim 1, wherein a gap is defined between the first and second substrates with the first connection electrodes spanning the gap to electrically interconnect the driving thin film transistors on the first substrate with respective ones of the second electrodes on the second substrate.

* * * * *